(12) United States Patent
Kim

(10) Patent No.: US 10,983,728 B2
(45) Date of Patent: Apr. 20, 2021

(54) SEMICONDUCTOR DEVICES

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 8 days.

(21) Appl. No.: 16/676,173

(22) Filed: Nov. 6, 2019

(65) Prior Publication Data
US 2020/0326886 A1 Oct. 15, 2020

(30) Foreign Application Priority Data

Apr. 10, 2019 (KR) .................. 10-2019-0042179

(51) Int. Cl.
*G11C 7/00* (2006.01)
*G06F 3/06* (2006.01)
*G11C 11/4076* (2006.01)
*G11C 11/4096* (2006.01)

(52) U.S. Cl.
CPC .......... *G06F 3/0659* (2013.01); *G06F 3/0604* (2013.01); *G06F 3/0634* (2013.01); *G06F 3/0656* (2013.01); *G06F 3/0679* (2013.01); *G11C 11/4076* (2013.01); *G11C 11/4096* (2013.01)

(58) Field of Classification Search
CPC ....... G11C 7/1078; G11C 7/22; G11C 7/1006; G11C 7/1072; G11C 7/1096
USPC ......................... 365/189.16, 189.14
See application file for complete search history.

(56) References Cited

U.S. PATENT DOCUMENTS

| 2006/0176761 A1* | 8/2006 | Lee ................. H03L 7/0995 365/233.1 |
| 2012/0002494 A1* | 1/2012 | Kim ................. G11C 29/46 365/201 |

FOREIGN PATENT DOCUMENTS

KR    1020170088138 A    8/2017

* cited by examiner

*Primary Examiner* — Son T Dinh
(74) *Attorney, Agent, or Firm* — William Park & Associates Ltd.

(57) ABSTRACT

A semiconductor device includes a mode control circuit, a write control circuit and an internal data generation circuit. The mode control circuit activates a pattern input mode according to a logic level combination of a chip selection signal, configured to activate a command/address signal to generate an operation set signal from the command/address signal. The mode control circuit generates a mode control signal, which is enabled by the operation set signal, according to a logic level combination of the chip selection signal and the command/address signal, in a write mode after the pattern input mode is activated. The write control circuit generates a write enablement signal, which is enabled according to a logic level of the mode control signal. The internal data generation circuit generates internal data to be stored into a core circuit according to the write enablement signal.

24 Claims, 12 Drawing Sheets

FIG. 5

| MODE | CLK EDGE | CS | CA<1> | CA<2> | CA<3> | CA<4> | CA<5> | CA<6> | CA<7> |
|---|---|---|---|---|---|---|---|---|---|
| CAS | Rising | H | L | L | H | H | DC2<1> | DC2<2> | DC2<3> |
| CAS | Falling | X | DC1<1> | DC1<2> | DC1<3> | DC1<4> | WRX_CON | WRX_BL | DC2<4> |
| WT16 | Rising | H | L | H | H | X | X | X | X |
| WT32 | Rising | H | L | L | H | L | X | X | X |

SEMICONDUCTOR DEVICES

CROSS-REFERENCE TO RELATED APPLICATIONS

The present application claims priority under 35 U.S.C 119(a) to Korean Application No. 10-2019-0042179, filed on Apr. 10, 2019, which is incorporated herein by reference in its entirety.

BACKGROUND

1. Technical Field

Embodiments of the present disclosure relate to semiconductor devices storing data that are inputted through a command/address signal.

2. Related Art

In general, each semiconductor device, such as a dynamic random access memory (DRAM) device, may include a plurality of bank groups, comprised of cell arrays, which are selected by addresses. Each of the bank groups may include a plurality of banks. The semiconductor device may select any one of the plurality of bank groups and may perform a column operation for outputting data stored in a cell array, included in the selected bank group, through input/output (I/O) lines.

SUMMARY

According to an embodiment, a semiconductor device includes a mode control circuit, a write control circuit and an internal data generation circuit. The mode control circuit is configured to activate a pattern input mode according to a logic level combination of a chip selection signal and configured to activate a command/address signal to generate an operation set signal from the command/address signal. In addition, the mode control circuit is configured to generate a mode control signal, which is enabled by the operation set signal, according to a logic level combination of the chip selection signal and the command/address signal, in a write mode after the pattern input mode is activated. The write control circuit is configured to generate a write enablement signal, which is enabled according to a logic level of the mode control signal. The internal data generation circuit is configured to generate internal data to be stored into a core circuit according to the write enablement signal.

According to another embodiment, a semiconductor device includes a mode control circuit, a write control circuit and a data input circuit. The mode control circuit is configured to activate a pattern input mode according to a logic level combination of a chip selection signal and configured to activate a command/address signal to generate an operation set signal and a burst set signal from the command/address signal. In addition, the mode control circuit is configured to generate a first mode control signal and a second mode control signal, which are enabled by the operation set signal, according to a logic level combination of the chip selection signal and the command/address signal, in a first write mode and a second write mode after the pattern input mode is activated. The write control circuit is configured to generate a write enablement signal, which is enabled according to logic levels of the first mode control signal and the second mode control signal.

BRIEF DESCRIPTION OF THE DRAWINGS

FIG. 5 is a table illustrating logic levels of a command/address signal inputted to a semiconductor device, according to an embodiment of the present disclosure.

DETAILED DESCRIPTION OF THE EMBODIMENTS

Figure 1:
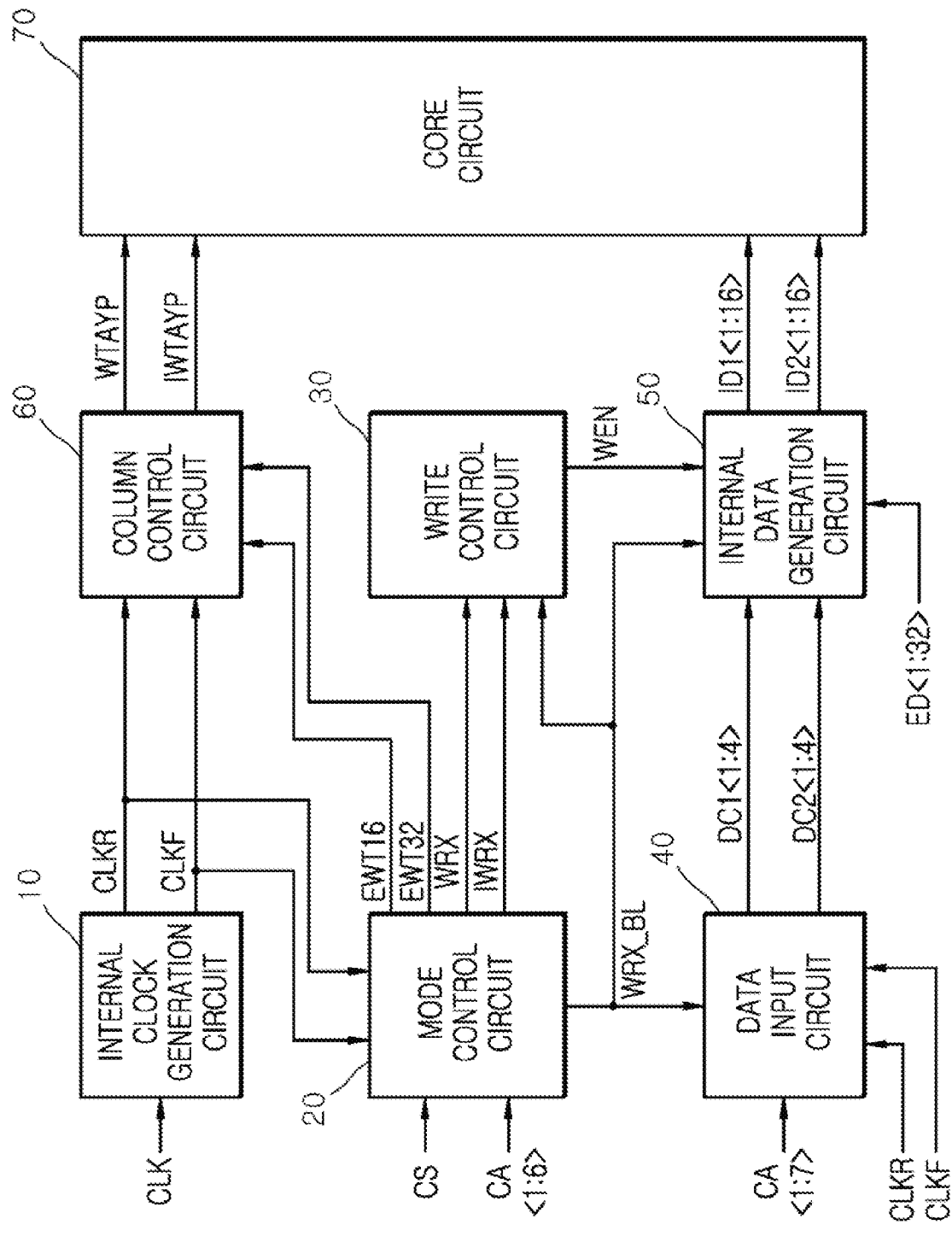
FIG. 1 is a block diagram illustrating a configuration of a semiconductor device, according to an embodiment of the present disclosure.

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

The embodiments according to the concept of the present disclosure can be modified in various ways and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

Various embodiments of the present disclosure will be described, hereinafter, with reference to the accompanying drawings. However, the embodiments described herein are for illustrative purposes only and are not intended to limit the scope of the present disclosure.

As illustrated in FIG. 1, a semiconductor device 1, according to an embodiment, may include an internal clock generation circuit 10, a mode control circuit 20, a write control circuit 30, a data input circuit 40, an internal data generation circuit 50, a column control circuit 60, and a core circuit 70.

The internal clock generation circuit 10 may generate a first internal clock signal CLKR and a second internal clock signal CLKF from a clock signal CLK. The internal clock generation circuit 10 may buffer the clock signal CLK to generate the first internal clock signal CLKR and may inversely buffer the clock signal CLK to generate the second internal clock signal CLKF. The first internal clock signal CLKR may be generated to have the same phase as the clock signal CLK, and the second internal clock signal CLKF may be generated to have an inverted phase of a phase of the clock signal CLK. The clock signal CLK may be a signal which is periodically toggled to synchronize an operation of the semiconductor device 1.

The mode control circuit 20 may activate a pattern input mode according to a logic level combination of a chip selection signal CS and may activate first to fourth command/address signals CA<1:4> to generate an operation set signal (WRX_CON of FIG. 2) from a fifth command/address signal CA<5>. The mode control circuit 20 may activate the pattern input mode according to a logic level combination of the chip selection signal CS and the first to fourth command/address signals CA<1:4> to generate a burst set signal WRX_BL from a sixth command/address signal CA<6>. The mode control circuit 20 may activate the pattern input mode according to a logic level combination of the chip selection signal CS and the first to fourth command/address signals CA<1:4> and may generate a first mode control signal WRX, which is enabled by the operation set signal (WRX_CON of FIG. 2), during a first write mode after the pattern input mode is activated. The mode control circuit 20 may activate the pattern input mode according to a logic level combination of the chip selection signal CS and the first to fourth command/address signals CA<1:4> and may generate the first mode control signal WRX and a second mode control signal IWRX, which are sequentially enabled by the operation set signal (WRX_CON of FIG. 2) during the first write mode after the pattern input mode is activated. The mode control circuit 20 may activate the pattern input mode according to a logic level combination of the chip selection signal CS and the first to fourth command/address signals CA<1:4> and may generate a first write signal EWT16, which is enabled during the first write mode after the pattern input mode is activated. The mode control circuit 20 may activate the pattern input mode according to a logic level combination of the chip selection signal CS and the first to fourth command/address signals CA<1:4> and may generate a second write signal EWT32, which is enabled during a second write mode after the pattern input mode is activated. Logic level combinations of the chip selection signal CS and the first to fourth command/address signals CA<1:4>, for activating the pattern input mode, the first write mode, and the second write mode, will be described in detail with reference to FIG. 5 later. Bits of the first to sixth command/address signals CA<1:6>, for generating the operation set signal (WRX_CON of FIG. 2) and the burst set signal WRX_BL will be described in detail with reference to FIG. 5 as well.

The pattern input mode may be set as an operation mode for storing first internal data ID1<1:16> and second internal data ID2<1:16> into the core circuit 70. The first internal data ID1<1:16> and second internal data ID2<1:16>, which are generated by decoding first input data DC1<1:4> and second input data DC2<1:4>, may be inputted through first to seventh command/address signals CA<1:7> without using external data ED<1:32>, provided by an external device. The first write mode may be set as an operation mode for storing the first internal data ID1<1:16>, which is generated by decoding the first input data DC1<1:4>, inputted through the first to seventh command/address signals CA<1:7>, into the core circuit 70. The first write mode may be set as an operation mode for storing the first internal data ID1<1:16>, having sixteen bits, into the core circuit 70 using a single operation. The number (i.e., sixteen) of bits of data stored by a single operation in the first write mode may also be known its burst length (i.e., sixteen).

The second write mode may be set as an operation mode for storing the first internal data ID1<1:16> and the second internal data ID2<1:16>, which is generated by decoding the first input data DC1<1:4> and the second input data DC2<1:4>, inputted through the first to seventh command/address signals CA<1:7>, into the core circuit 70. The second write mode may be set as an operation mode for storing the first and second internal data ID1<1:16> and ID2<1:16>, having thirty-two bits, into the core circuit 70 using a single operation. The number (i.e., thirty-two) of bits of data stored by a single operation in the second write mode may also be known its burst length (i.e., thirty-two). In an embodiment, if the burst length BL is "N" in the first write mode, the burst length in the second write mode may be "2N". The external data ED<1:32> may be set as a signal which is inputted through a data input/output (I/O) pad.

The write control circuit 30 may generate a write enablement signal WEN, which is enabled according to logic levels of the first and second mode control signals WRX and IWRX. The write control circuit 30 may generate the write enablement signal WEN, which is enabled during a predetermined period from a point in time when the first mode control signals WRX is enabled in the event that the burst set signal WRX_BL is disabled. The write control circuit 30 may generate the write enablement signal WEN which is enabled according to logic levels of the first and second mode control signals WRX and IWRX when the burst set signal WRX_BL is enabled.

The word "predetermined" as used herein with respect to a parameter, such as a predetermined period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The data input circuit 40 may be synchronized with the first internal clock signal CLKR and the second internal clock signal CLKF according to the burst set signal WRX_BL to generate the first input data DC1<1:4> and the second input data DC2<1:4> from the first to seventh command/address signals CA<1:7>. The data input circuit 40 may be synchronized with the second internal clock signal CLKF to generate the first input data DC1<1:4> from the first to fourth command/address signals CA<1:4> when the burst set signal WRX_BL is disabled. The data input circuit 40 may be synchronized with the first internal clock signal CLKR and the second internal clock signal CLKF to generate the first input data DC1<1:4> and the second input data DC2<1:4> from the first to seventh command/address signals CA<1:7> when the burst set signal WRX_BL is enabled. Bits of the first to seventh command/address signals CA<1:7> for generating the first input data DC1<1:4> and the second input data DC2<1:4> will be described in detail with reference to FIG. 5 later.

The internal data generation circuit 50 may generate the first internal data ID1<1:16> from the first input data DC1<1:4> while the write enablement signal WEN is enabled. The internal data generation circuit 50 may generate the second internal data ID2<1:16> from the second input data DC2<1:4> while the write enablement signal WEN is enabled. The internal data generation circuit 50 may generate the first internal data ID1<1:16> from the first to sixteenth external data ED<1:16> while the write enablement signal WEN is disabled. The internal data generation circuit 50 may generate the second internal data ID2<1:16> from the seventeenth to thirty-second external data ED<17:32> while the write enablement signal WEN is disabled.

The column control circuit 60 may delay the first write signal EWT16 and the second write signal EWT32 in synchronization with the first internal clock signal CLKR and the second internal clock signal CLKF to generate a first column control pulse WTAYP and a second column control pulse IWTAYP. The column control circuit 60 may generate the first column control pulse WTAYP and the second column control pulse IWTAYP by delaying the first write signal EWT16 and the second write signal EWT32 by a delay time corresponding to a write latency in synchronization with the first internal clock signal CLKR and the second internal clock signal CLKF. The delay time of the first write signal EWT16 and the second write signal EWT32 in the column control circuit 60 may be set to be different according to the embodiments.

The core circuit 70 may store the first internal data ID1<1:16> when the first column control pulse WTAYP is enabled. The core circuit 70 may store the first internal data ID1<1:16> and the second internal data ID2<1:16> when the second column control pulse IWTAYP is enabled. Although FIG. 1 illustrates an example in which the core circuit 70 is configured to store the first internal data ID1<1:16> and the second internal data ID2<1:16> in the first write mode and the second write mode, the core circuit 70 may operate in a read mode outputting the first and second internal data ID1<1:16> and ID2<1:16> stored in the core circuit 70 to an external device.

Figure 2:
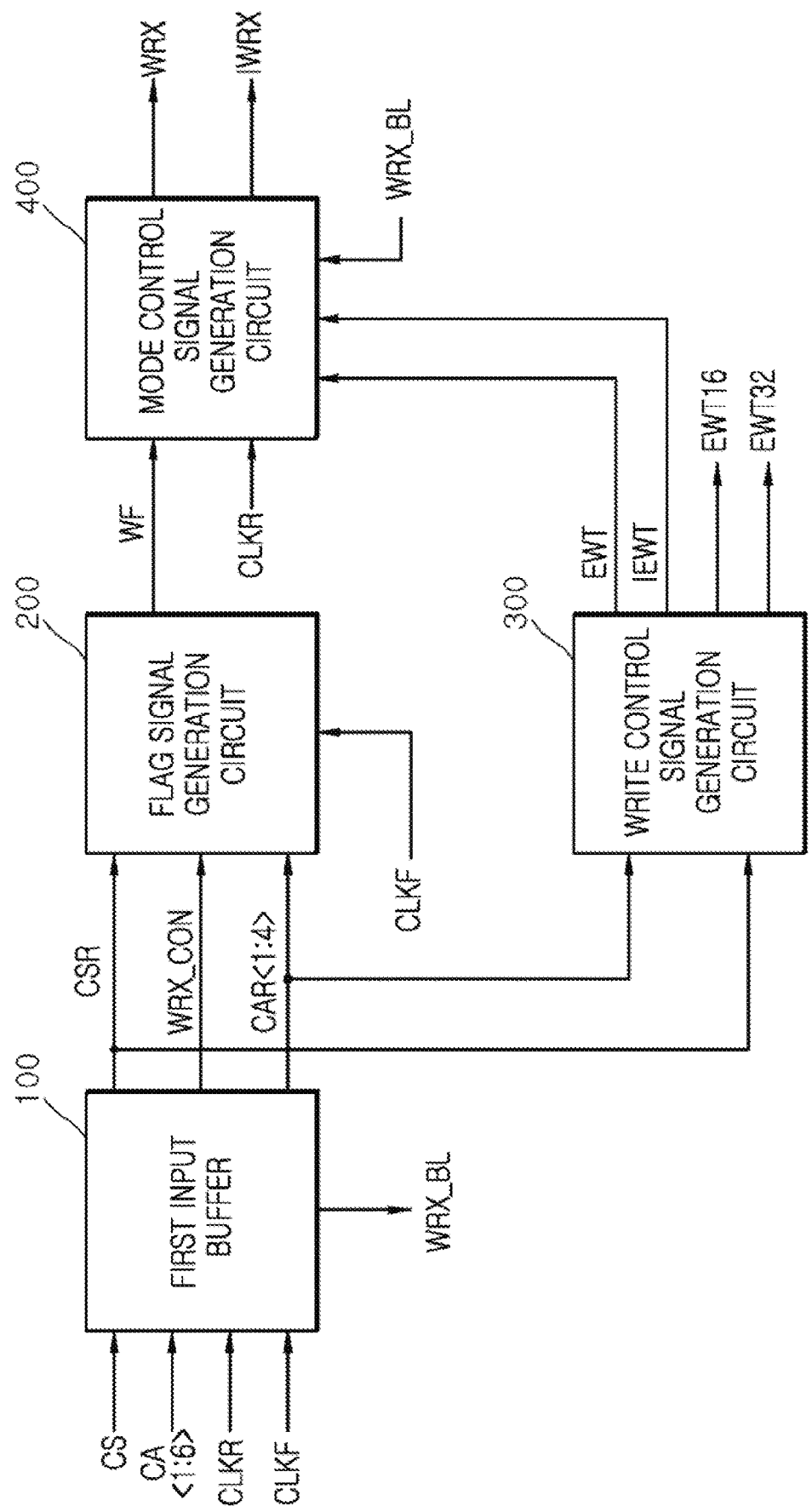
FIG. 2 is a block diagram illustrating a configuration of a mode control circuit included in the semiconductor device of FIG. 1.

Referring to FIG. 2, the mode control circuit 20 may include a first input buffer 100, a flag signal generation circuit 200, a write control signal generation circuit 300 and a mode control signal generation circuit 400.

The first input buffer 100 may latch the chip selection signal CS in synchronization with the first internal clock signal CLKR to generate a rising chip selection signal CSR. The first input buffer 100 may be synchronized with the first internal clock signal CLKR to generate first to fourth rising command signals CAR<1:4> from some bits of the first to sixth command/address signals CA<1:6>. The first input buffer 100 may be synchronized with the second internal clock signal CLKF to generate the operation set signal WRX_CON from any bit of the first to sixth command/address signals CA<1:6>. The first input buffer 100 may be synchronized with the second internal clock signal CLKF to generate the burst set signal WRX_BL from any bit of the first to sixth command/address signals CA<1:6>. Bits of the first to sixth command/address signals CA<1:6> for generating the first to fourth rising command signals CAR<1:4>, the operation set signal WRX_CON and the burst set signal WRX_BL will be described in detail with reference to FIG. 5 later.

The flag signal generation circuit 200 may be synchronized with the second internal clock signal CLKF to generate a flag signal WF which is enabled when the rising chip selection signal CSR and the first to fourth rising command signals CAR<1:4> have a first logic level combination and the operation set signal WRX_CON has a first logic level (e.g., a logic "high" level). The first logic level combination of the rising chip selection signal CSR and the first to fourth rising command signals CAR<1:4> will be described in detail with reference to FIG. 5 later.

The write control signal generation circuit 300 may generate a first write control signal EWT which is enabled when the rising chip selection signal CSR and the first to third rising command signals CAR<1:3> have a second logic level combination. The write control signal generation circuit 300 may generate the first write control signal EWT and a second write control signal IEWT which are sequentially enabled when the rising chip selection signal CSR and the first to fourth rising command signals CAR<1:4> have a third logic level combination. The write control signal generation circuit 300 may generate the first write signal EWT16 which is enabled when the rising chip selection signal CSR and the first to third rising command signals CAR<1:3> have the second logic level combination. The write control signal generation circuit 300 may generate the second write signal EWT32 which is enabled when the rising chip selection signal CSR and the first to fourth rising command signals CAR<1:4> have the third logic level combination. The second logic level combination of the rising chip selection signal CSR and the first to third rising command signals CAR<1:3> will be described in detail with reference to FIG. 5 later. The third logic level combination of the rising chip selection signal CSR and the first to fourth rising command signals CAR<1:4> will be described in detail with reference to FIG. 5 later.

The mode control signal generation circuit 400 may be synchronized with the first internal clock signal CLKR to generate the first mode control signal WRX which is enabled when both of the flag signal WF and the first write control signal EWT are enabled. The mode control signal generation circuit 400 may be synchronized with the first internal clock signal CLKR to generate the second mode control signal IWRX which is enabled when all of the flag signal WF, the burst set signal WRX_BL and the second write control signal IEWT are enabled.

Figure 3:
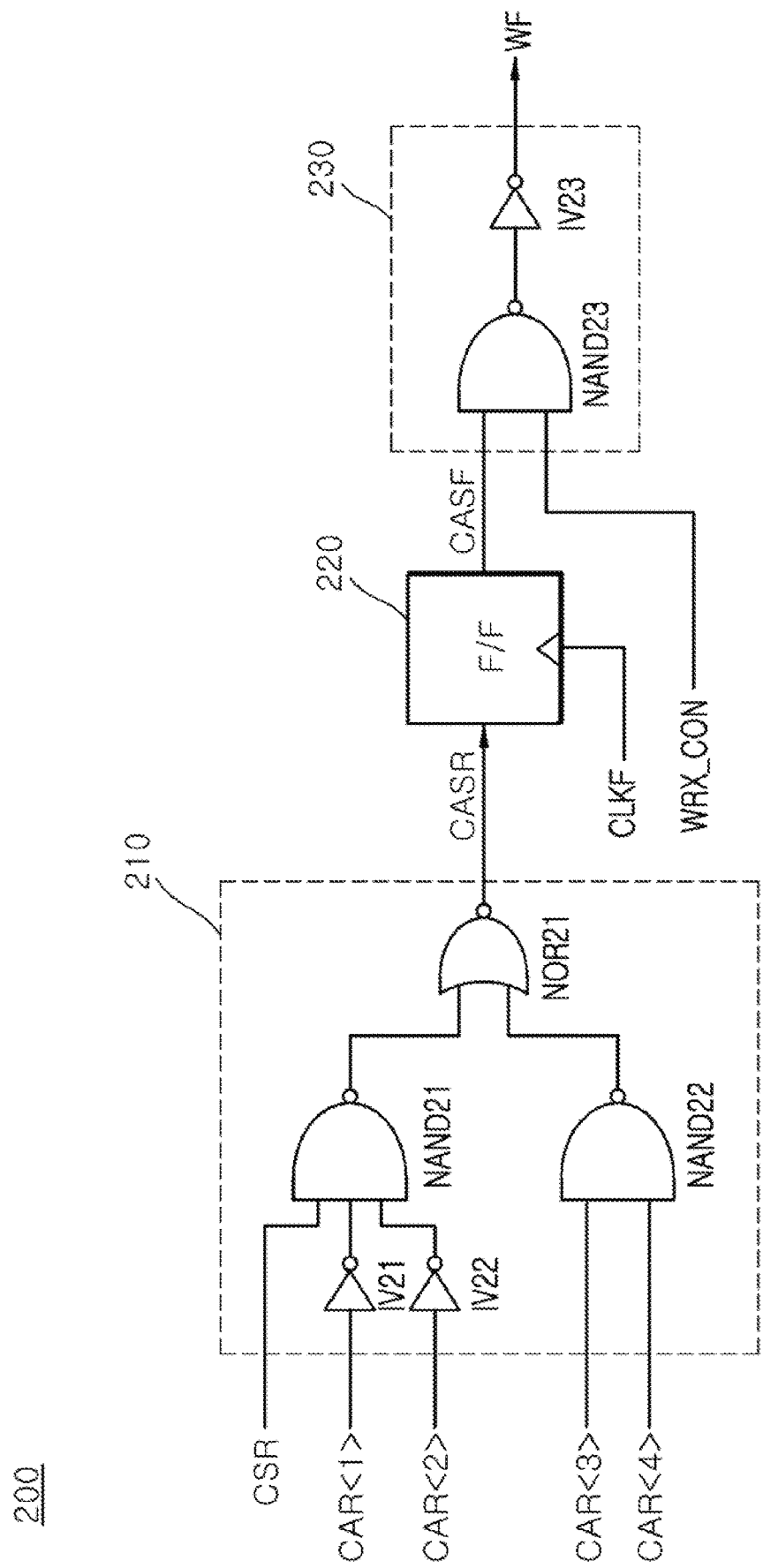
FIG. 3 is circuit diagram illustrating a configuration of a flag signal generation circuit included in the mode control circuit of FIG. 2.

Referring to FIG. 3, the flag signal generation circuit 200 may include a first operation signal generation circuit 210, a second operation signal generation circuit 220 and a flag signal output circuit 230.

The first operation signal generation circuit 210 may be configured to perform inversion operations, NAND operations and a NOR operation. For example, the first operation signal generation circuit 210 may include inverters IV21 and IV22, NAND gates NAND21 and NAND22 and a NOR gate NOR21. The first operation signal generation circuit 210 may generate a first operation signal CASR which is enabled to have a logic "high" level when the rising chip selection signal CSR and the first to fourth rising command signals CAR<1:4> have the first logic level combination. The first operation signal generation circuit 210 may generate the first operation signal CASR which is enabled to have a logic "high" level when the rising chip selection signal CSR has a logic "high" level, the first rising command signal CAR<1> has a logic "low" level, the second rising command signal CAR<2> has a logic "low" level, the third rising command signal CAR<3> has a logic "high" level, and the fourth rising command signal CAR<4> has a logic "high" level.

The second operation signal generation circuit 220 may include a flip-flop "F/F". The second operation signal generation circuit 220 may be synchronized with the second internal clock signal CLKF to latch the first operation signal CASR. The second operation signal generation circuit 220 may be synchronized with the second internal clock signal CLKF to output the latched signal of the first operation signal CASR as a second operation signal CASF.

The flag signal output circuit 230 may be configured to perform a NAND operation and an inversion operation. For example, the flag signal output circuit 230 may include a NAND gate NAND23 and an inverter IV23. The flag signal output circuit 230 may generate the flag signal WF from the second operation signal CASF when the operation set signal WRX_CON has the first logic level (e.g., a logic "high" level). The flag signal output circuit 230 may buffer the second operation signal CASF to generate the flag signal WF when the operation set signal WRX_CON has the first logic level (e.g., a logic "high" level). The flag signal output circuit 230 may perform a logical AND operation of the operation set signal WRX_CON and the second operation signal CASF to generate the flag signal WF.

Figure 4:
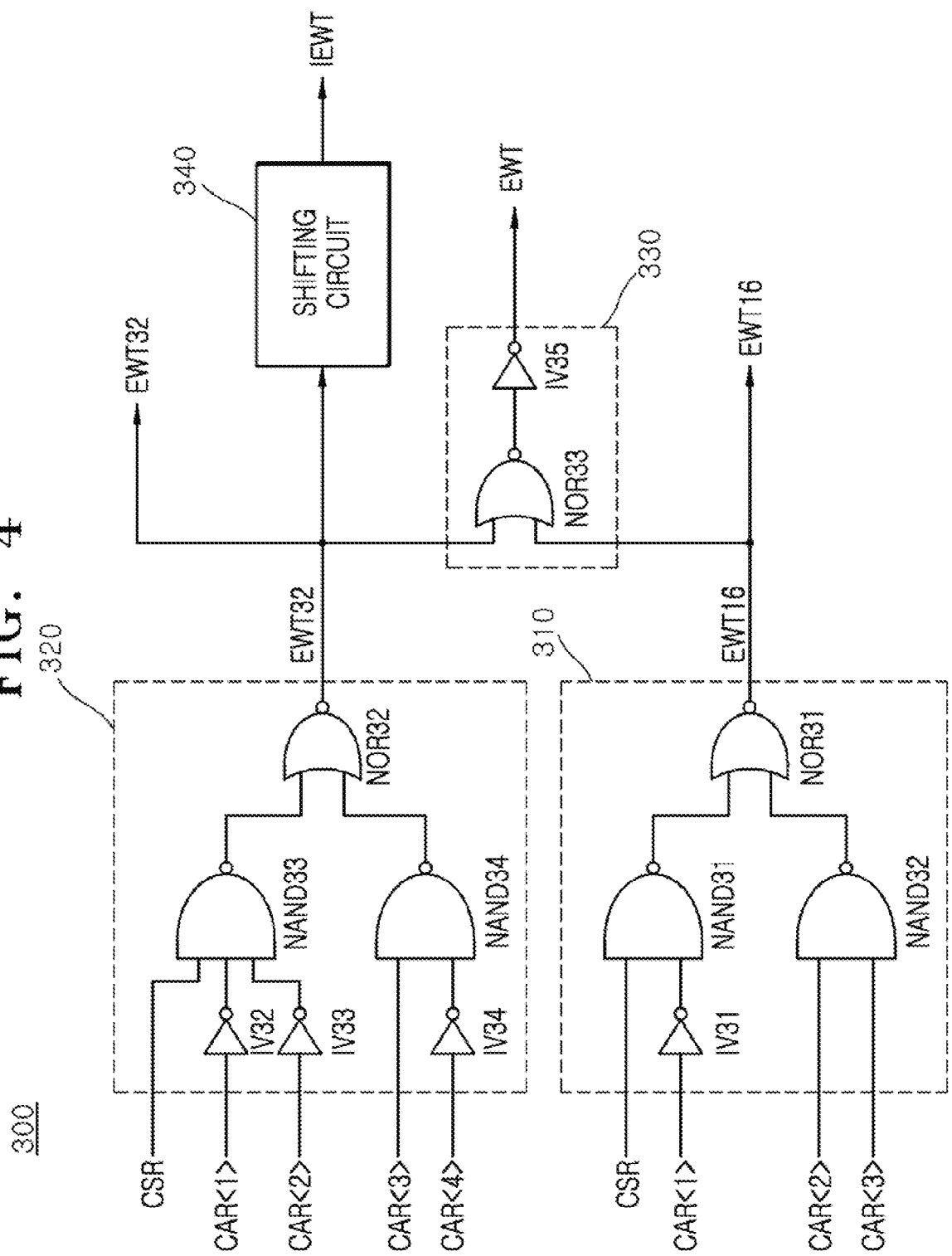
FIG. 4 is circuit diagram illustrating a configuration of a write control signal generation circuit included in the mode control circuit of FIG. 2.

Referring to FIG. 4, the write control signal generation circuit 300 may include a first write signal generation circuit 310, a second write signal generation circuit 320, a first logic circuit 330 and a shifting circuit 340.

The first write signal generation circuit 310 may be configured to perform an inversion operation, NAND operations, and a NOR operation. For example, the first write signal generation circuit 310 may include an inverter IV31, NAND gates NAND31 and NAND32 and a NOR gate NOR31. The first write signal generation circuit 310 may generate the first write signal EWT16 which is enabled to have a logic "high" level when the rising chip selection signal CSR and the first to third rising command signals CAR<1:3> have the second logic level combination. The first write signal generation circuit 310 may generate the first write signal EWT16 which is enabled to have a logic "high" level when the rising chip selection signal CSR has a logic "high" level, the first rising command signal CAR<1> has a logic "low" level, the second rising command signal CAR<2> has a logic "high" level, and the third rising command signal CAR<3> has a logic "high" level.

The second write signal generation circuit 320 may be configured to perform inversion operations, NAND operations, and a NOR operation. For example, the firs second write signal generation circuit 320 may include inverters IV32, IV33 and IV34, NAND gates NAND33 and NAND34 and a NOR gate NOR32. The second write signal generation circuit 320 may generate the second write signal EWT32 which is enabled to have a logic "high" level when the rising chip selection signal CSR and the first to fourth rising command signals CAR<1:4> have the third logic level combination. The second write signal generation circuit 320 may generate the second write signal EWT32 which is enabled to have a logic "high" level when the rising chip selection signal CSR has a logic "high" level, the first rising command signal CAR<1> has a logic "low" level, the second rising command signal CAR<2> has a logic "low" level, the third rising command signal CAR<3> has a logic "high" level, and the fourth rising command signal CAR<4> has a logic "low" level.

The first logic circuit 330 may be configured to perform a NOR operation and an inversion operation. For example, the first logic circuit 330 may include a NOR gate NOR33 and an inverter IV35. The first logic circuit 330 may generate the first write control signal EWT which is enabled to have a logic "high" level when any one of the first and second write signals EWT16 and EWT32 is enabled to have a logic "high" level. The first logic circuit 330 may generate the first write control signal EWT which is enabled to have a logic "high" level when the second write signal EWT32 is enabled to have a logic "high" level. The first logic circuit 330 may perform a logical OR operation of the first and second write signals EWT16 and EWT32 to generate the first write control signal EWT.

The shifting circuit 340 may shift the second write signal EWT32 to generate the second write control signal IEWT. A delay time for shifting the second write signal EWT32 may be set to be different according to the embodiments.

Various logic level combinations of the chip selection signal CS and the first to seventh command/address signals CA<1:7> for activating the pattern input mode, the first write mode and the second write mode will be described hereinafter with reference to FIG. 5.

First, the first logic level combination of the chip selection signal CS and the first to seventh command/address signals CA<1:7> for activating the pattern input mode "CAS" may be set as a logic level combination when the chip selection signal CS and the first to fourth command/address signals CA<1:4>, inputted in synchronization with a rising edge of the clock signal CLK, respectively, have a logic "high" level, a logic "low" level, a logic "low" level, a logic "high" level and a logic "high" level. In such a case, the fifth to seventh command/address signals CA<5:7> may be used to generate the second input data DC2<1:3>. That is, the first logic level combination of the rising chip selection signal CSR and the first to fourth command/address signals CA<1:4>, for activating the pattern input mode "CAS," may be set as a logic level combination of when the rising chip selection signal CSR and the first to fourth rising command signals CAR<1:4>, respectively, have a logic "high" level, a logic "low" level, a logic "low" level, a logic "high" level and a logic "high" level.

Next, the second logic level combination of the chip selection signal CS and the first to seventh command/address signals CA<1:7>, for activating the first write mode "WL16," may be set as a logic level combination of when the chip selection signal CS and the first to third command/address signals CA<1:3>, inputted in synchronization with a rising edge of the clock signal CLK, respectively, have a logic "high" level, a logic "low" level, a logic "high" level and a logic "high" level. In such a case, the fourth to seventh command/address signals CA<4:7> may have a "don't care state (X)". That is, the second logic level combination of the rising chip selection signal CSR and the first to third command/address signals CA<1:3>, for activating the first write mode "WL16," may be set as a logic level combination of when the rising chip selection signal CSR and the first to third rising command signals CAR<1:3>, respectively, have a logic "high" level, a logic "low" level, a logic "high" level and a logic "high" level.

Next, the third logic level combination of the chip selection signal CS and the first to seventh command/address signals CA<1:7> for activating the second write mode "WL32" may be set as a logic level combination when the chip selection signal CS and the first to fourth command/address signals CA<1:4>, inputted in synchronization with a rising edge of the clock signal CLK, respectively, have a logic "high" level, a logic "low" level, a logic "low" level, a logic "high" level and a logic "low" level. In such a case, the fifth to seventh command/address signals CA<4:7> may have a "don't care state (X)". That is, the third logic level combination of the rising chip selection signal CSR and the first to fourth command/address signals CA<1:4>, for activating the second write mode "WL32," may be set as a logic level combination of when the rising chip selection signal CSR and the first to fourth rising command signals CAR<1:4>, respectively, have a logic "high" level, a logic "low" level, a logic "low" level, a logic "high" level and a logic "low" level.

Bits of the first to seventh command/address signals CA<1:7> for generating the operation set signal WRX_CON and the burst set signal WRX_BL will be described hereinafter with reference to FIG. 5.

The operation set signal WRX_CON may be inputted through the fifth command/address signal CA<5> at a falling edge of the clock signal CLK after the pattern input mode "CAS" is activated. The pattern input mode may be executed when the operation set signal WRX_CON is generated to have a logic "high" level. If the operation set signal WRX_CON is generated to have a logic "low" level, a normal write operation may be performed without execution of the pattern input mode.

The burst set signal WRX_BL may be inputted through the sixth command/address signal CA<6> at a falling edge of the clock signal CLK after the pattern input mode "CAS" is activated. When the burst set signal WRX_BL is generated to have a logic "low" level, the semiconductor device 1 may perform an operation for storing the first internal data ID1<1:16> having sixteen bits, which are generated from the first input data DC1<1:4> in the first write mode "WL16", into the core circuit 70. When the burst set signal WRX_BL is generated to have a logic "high" level, the semiconductor device 1 may perform an operation for storing the first and second internal data ID1<1:16> and ID2<1:16>, having thirty-two bits, into the core circuit 70. The first and second internal data ID1<1:16> and ID2<1:16> are generated from the first and second input data DC1<1:4> and DC2<1:4> in the second write mode "WL32."

Bits of the first to seventh command/address signals CA<1:7> for generating the first input data DC1<1:4> and the second input data DC2<1:4> will be described hereinafter with reference to FIG. 5.

First, the bit of the first to seventh command/address signals CA<1:7>, for generating the first bit DC1<1> of the first input data DC1<1:4>, may be set as the first command/address signal CA<1>, which is inputted in synchronization with a falling edge of the clock signal CLK in the pattern input mode "CAS". The bit of the first to seventh command/address signals CA<1:7>, for generating the second bit DC1<2> of the first input data DC1<1:4>, may be set as the second command/address signal CA<2>, which is inputted in synchronization with a falling edge of the clock signal CLK in the pattern input mode "CAS". The bit of the first to seventh command/address signals CA<1:7>, for generating the third bit DC1<3> of the first input data DC1<1:4>, may be set as the third command/address signal CA<3>, which is inputted in synchronization with a falling edge of the clock signal CLK in the pattern input mode "CAS". The bit of the first to seventh command/address signals CA<1:7>, for generating the fourth bit DC1<4> of the first input data DC1<1:4>, may be set as the fourth command/address signal CA<4>, which is inputted in synchronization with a falling edge of the clock signal CLK in the pattern input mode "CAS".

Next, the bit of the first to seventh command/address signals CA<1:7>, for generating the first bit DC2<1> of the second input data DC2<1:4>, may be set as the fifth command/address signal CA<5>, which is inputted in synchronization with a rising edge of the clock signal CLK in the pattern input mode "CAS". The bit of the first to seventh command/address signals CA<1:7>, for generating the second bit DC2<2> of the second input data DC2<1:4>, may be set as the sixth command/address signal CA<6>, which is inputted in synchronization with a rising edge of the clock signal CLK in the pattern input mode "CAS". The bit of the first to seventh command/address signals CA<1:7>, for generating the third bit DC2<3> of the second input data DC2<1:4>, may be set as the seventh command/address signal CA<7>, which is inputted in synchronization with a rising edge of the clock signal CLK in the pattern input mode "CAS". The bit of the first to seventh command/address signals CA<1:7>, for generating the fourth bit DC2<4> of the second input data DC2<1:4>, may be set as the seventh command/address signal CA<7>, which is inputted in synchronization with a falling edge of the clock signal CLK in the pattern input mode "CAS".

Figure 6:
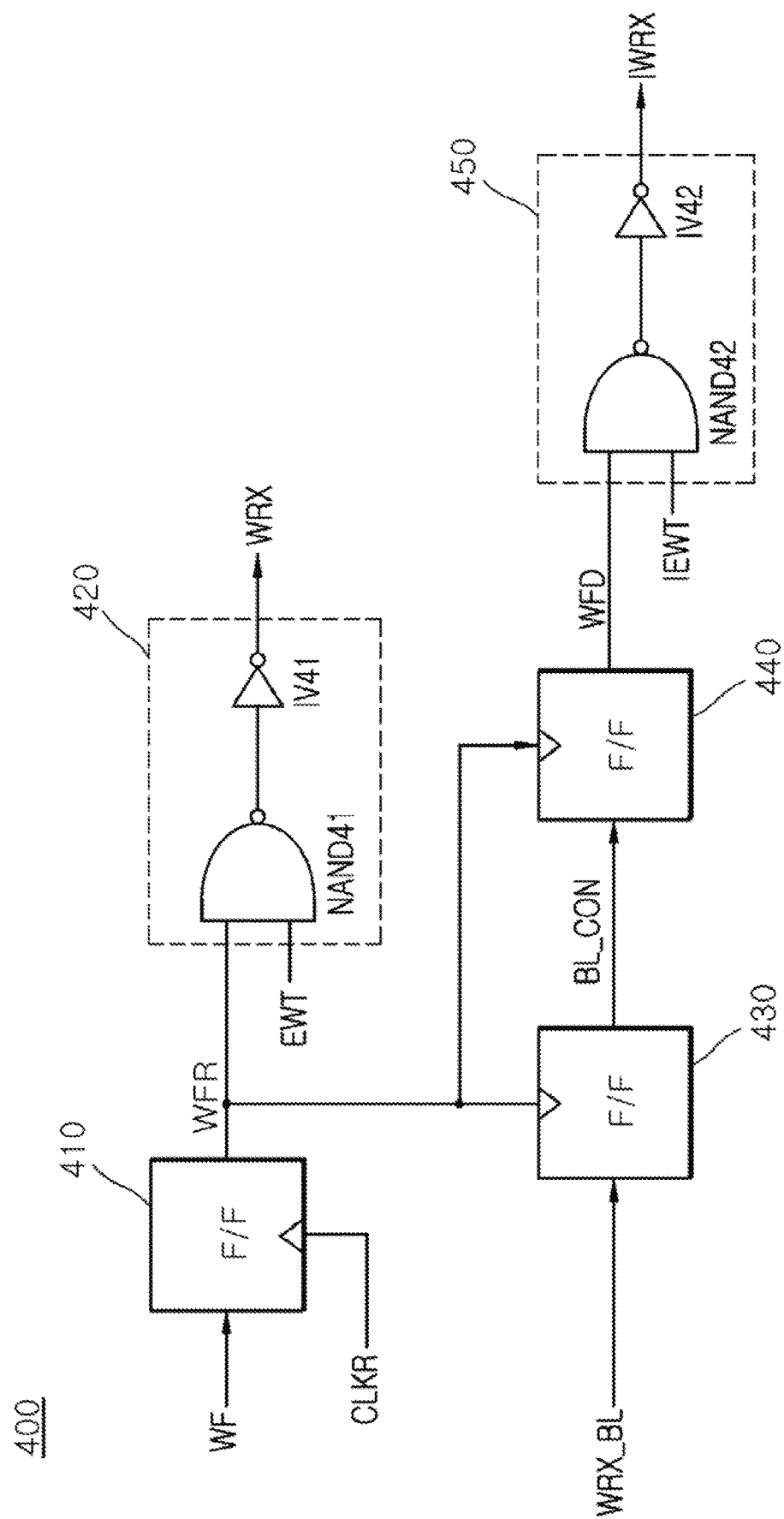
FIG. 6 is circuit diagram illustrating a configuration of a mode control signal generation circuit included in the mode control circuit of FIG. 2.

Referring to FIG. 6, the mode control signal generation circuit 400 may include a first pre-control signal generation circuit 410, a second logic circuit 420, a burst control signal generation circuit 430, a second pre-control signal generation circuit 440 and a third logic circuit 450.

The first pre-control signal generation circuit 410 may include a flip-flop "F/F". The first pre-control signal generation circuit 410 may be synchronized with the first internal clock signal CLKR to latch the flag signal WF. The first pre-control signal generation circuit 410 may be synchronized with the first internal clock signal CLKR to generate a first pre-control signal WFR from the latched signal of the flag signal WF.

The second logic circuit 420 may be configured to perform a NAND operation and an inversion operation. For example, the second logic circuit 420 may include a NAND gate NAND41 and an inverter IV41. The second logic circuit 420 may buffer the first pre-control signal WFR to generate the first mode control signal WRX when the first write control signal EWT is enabled to have a logic "high" level. The second logic circuit 420 may perform a logical AND operation of the first write control signal EWT and the first pre-control signal WFR to generate the first mode control signal WRX.

The burst control signal generation circuit 430 may include a flip-flop "F/F". The burst control signal generation circuit 430 may be synchronized with the first pre-control signal WFR to latch the burst set signal WRX_BL. The burst control signal generation circuit 430 may be synchronized with the first pre-control signal WFR to generate a burst control signal BL_CON from the latched signal of the burst set signal WRX_BL.

The second pre-control signal generation circuit 440 may include a flip-flop "F/F". The second pre-control signal generation circuit 440 may be synchronized with the first pre-control signal WFR to latch the burst control signal BL_CON. The second pre-control signal generation circuit 440 may be synchronized with the first pre-control signal WFR to generate a second pre-control signal WFD from the latched signal of the burst control signal BL_CON.

The third logic circuit 450 may be configured to perform a NAND operation and an inversion operation. For example, the third logic circuit 450 may include a NAND gate NAND42 and an inverter IV42. The third logic circuit 450 may buffer the second pre-control signal WFD to generate the second mode control signal IWRX when the second write control signal IEWT is enabled to have a logic "high" level. The third logic circuit 450 may perform a logical AND operation of the second write control signal IEWT and the second pre-control signal WFD to generate the second mode control signal IWRX.

Figure 7:
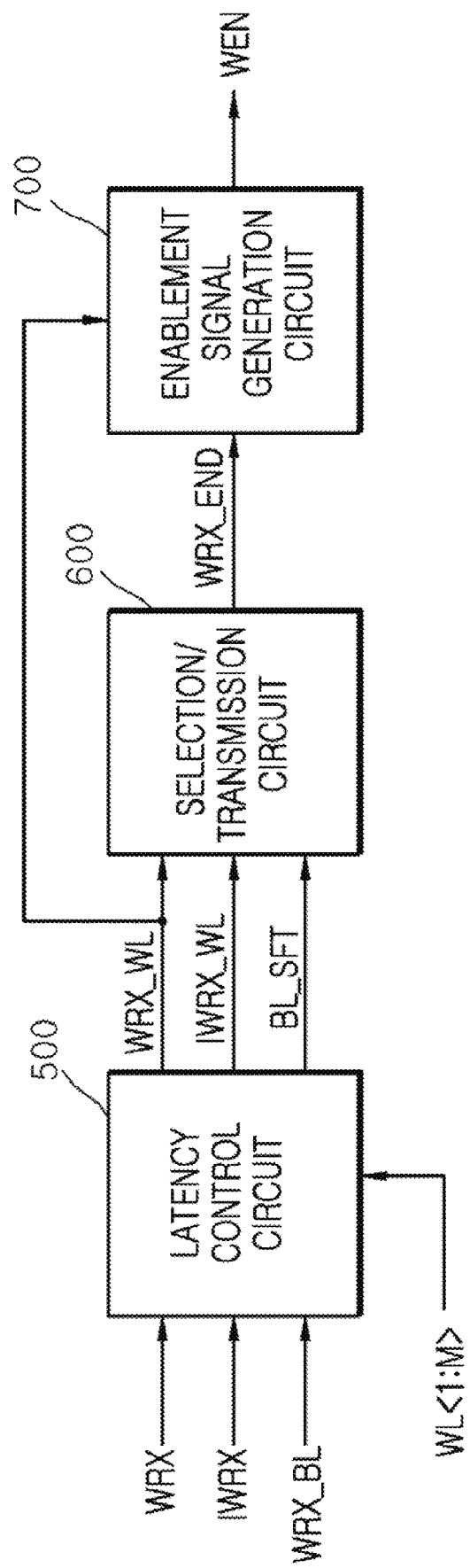
FIG. 7 is a block diagram illustrating a configuration of a write control circuit included in the semiconductor device of FIG. 1.

Referring to FIG. 7, the write control circuit 30 may include a latency control circuit 500, a selection/transmission circuit 600 and an enablement signal generation circuit 700.

The latency control circuit 500 may delay the first mode control signal WRX by a write latency time, according to a write latency control signal WL<1:M>, to generate a first write latency signal WRX_WL. The latency control circuit 500 may delay the second mode control signal IWRX by the write latency time, according to the write latency control signal WL<1:M>, to generate a second write latency signal IWRX_WL. The latency control circuit 500 may delay the burst set signal WRX_BL by the write latency time, according to the write latency control signal WL<1:M>, to generate a burst shift signal BL_SFT. The write latency control signal WL<1:M> may be set as a signal including information on the write latency time, and the number "M" of bits included in the write latency control signal WL<1:M> may be set to be different according to the embodiments. The write latency control signal WL<1:M> may be set as a signal which is generated by a mode register set (MRS) included in the semiconductor device 1.

The selection/transmission circuit 600 may shift the first write latency signal WRX_WL and the second write latency signal IWRX_WL. The selection/transmission circuit 600 may output one of the shifted signals of the first write latency signal WRX_WL and the second write latency signal IWRX_WL as an end signal WRX_END, according to the burst shift signal BL_SFT. The selection/transmission circuit 600 may output the shifted signal of the first write latency signal WRX_WL as the end signal WRX_END when the burst shift signal BL_SFT has a logic "low" level. The selection/transmission circuit 600 may output the shifted signal of the second write latency signal IWRX_WL as the end signal WRX_END when the burst shift signal BL_SFT has a logic "high" level.

The enablement signal generation circuit 700 may generate the write enablement signal WEN, which is enabled when the first write latency signal WRX_WL is inputted to the enablement signal generation circuit 700 and disabled when the end signal WRX_END is inputted to the enablement signal generation circuit 700. The enablement signal generation circuit 700 may generate the write enablement signal WEN, which is enabled to have a logic "high" level when the first write latency signal WRX_WL inputted to the enablement signal generation circuit 700 has a logic "high" level. The enablement signal generation circuit 700 may generate the write enablement signal WEN, which is disabled to have a logic "low" level when the end signal WRX_END inputted to the enablement signal generation circuit 700 has a logic "high" level.

Figure 8:
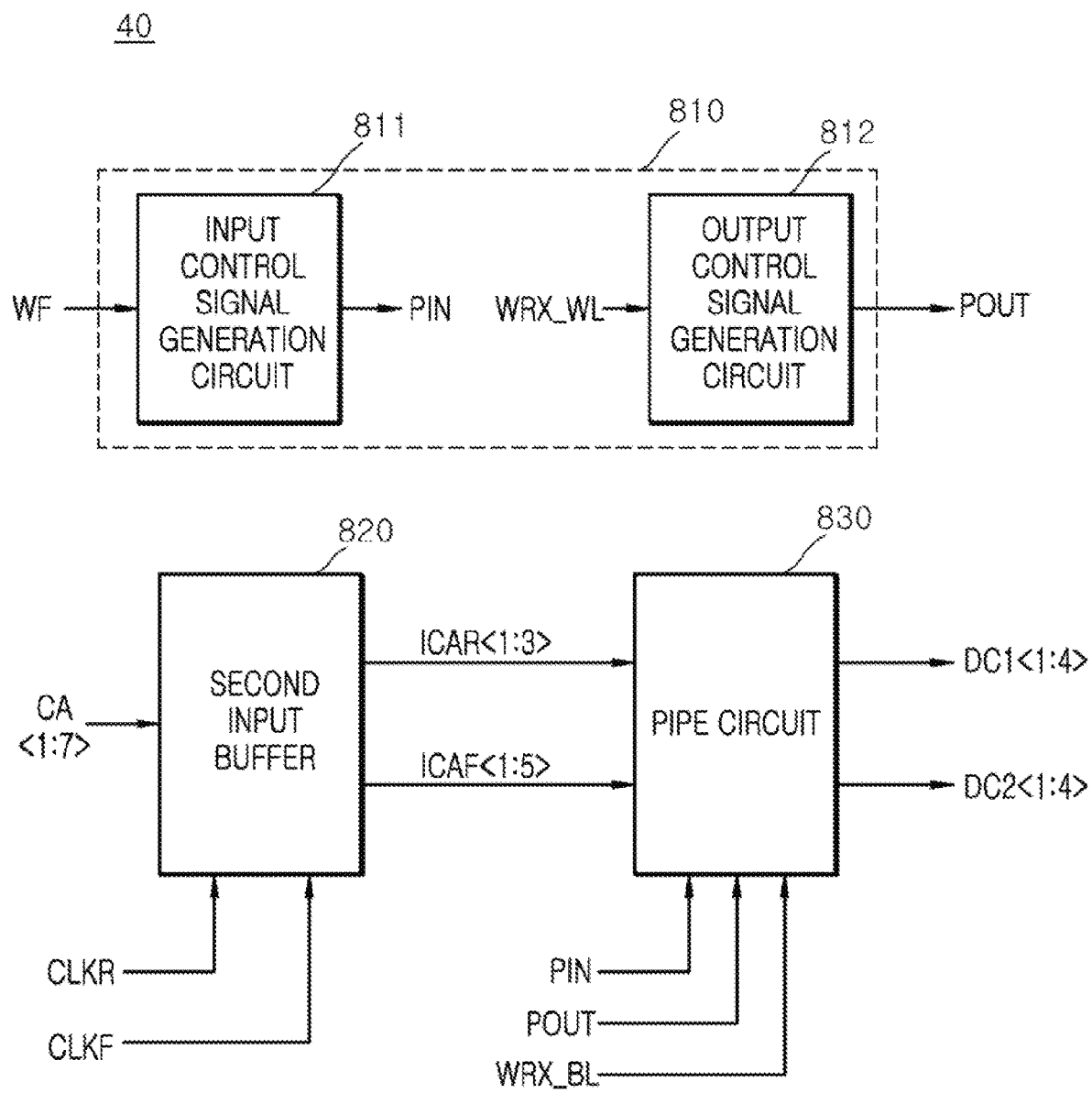
FIG. 8 is a block diagram illustrating a configuration of a data input circuit included in the semiconductor device of FIG. 1.

Referring to FIG. 8, the data input circuit 40 may include a pipe control circuit 810, a second input buffer 820 and a pipe circuit 830.

The pipe control circuit 810 may include an input control signal generation circuit 811 and an output control signal generation circuit 812.

The input control signal generation circuit 811 may generate an input control signal PIN, which is enabled when the flag signal WF is inputted to the input control signal generation circuit 811. The input control signal generation circuit 811 may generate the input control signal PIN, which is enabled to have a logic "high" level when the flag signal WF, inputted to the input control signal generation circuit 811, has a logic "high" level.

The output control signal generation circuit 812 may generate an output control signal POUT, which is enabled when the first write latency signal WRX_WL is inputted to the output control signal generation circuit 812. The output control signal generation circuit 812 may generate the output control signal POUT, which is enabled to have a logic "high" level when the first write latency signal WRX_WL, inputted to the output control signal generation circuit 812, has a logic "high" level.

The pipe control circuit 810, described above, may generate the input control signal PIN and the output control signal POUT, which are sequentially enabled, according to the flag signal WF and the first write latency signal WRX_WL.

The second input buffer 820 may be synchronized with the first internal clock signal CLKR to generate a first internal command/address signal ICAR<1:3> from the fifth to seventh command/address signals CA<5:7>. The second input buffer 820 may be synchronized with the second internal clock signal CLKF to generate a second internal command/address signal ICAF<1:5> from the first to fourth command/address signals CA<1:4> and the seventh command/address signal CA<7>.

The pipe circuit 830 may latch the first internal command/address signal ICAR<1:3> and the second internal command/address signal ICAF<1:5> when the input control signal PIN is inputted. The pipe circuit 830 may generate the first input data DC1<1:4> from data of the first to fourth bits ICAF<1:4> of the second internal command/address signal ICAF<1:5> when the output control signal POUT is inputted and the burst set signal WRX_BL is disabled to have a logic "low" level. The pipe circuit 830 may generate the first input data DC1<1:4> and the second input data DC2<1:4> from the first internal command/address signal ICAR<1:3> and the second internal command/address signal ICAF<1:5> when the output control signal POUT is inputted and when the burst set signal WRX_BL is enabled to have a logic "high" level.

Figure 9:
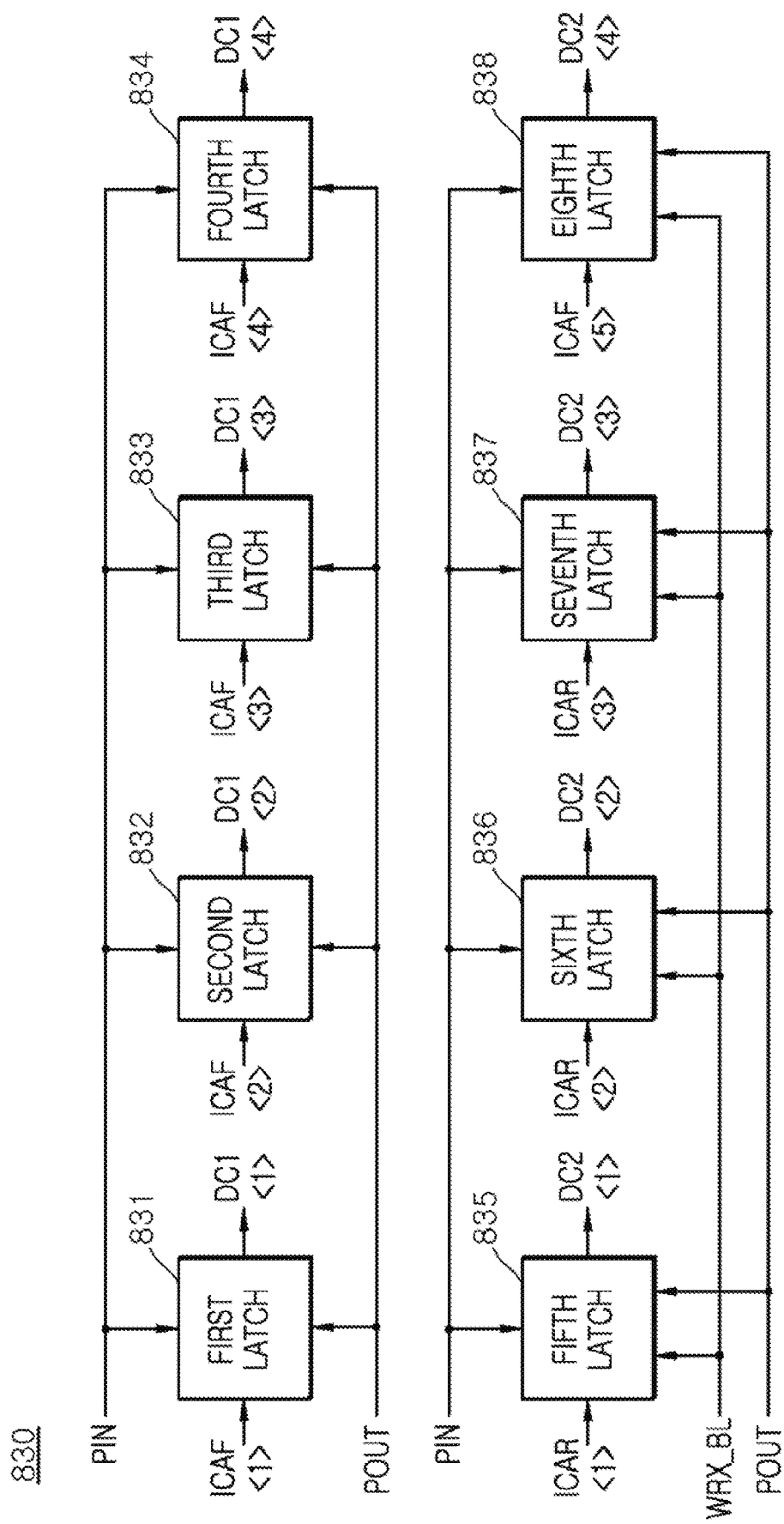
FIG. 9 is a block diagram illustrating a configuration of a pipe circuit included in the data input circuit of FIG. 8.

Referring to FIG. 9, the pipe circuit 830 may include a first latch 831, a second latch 832, a third latch 833, a fourth latch 834, a fifth latch 835, a sixth latch 836, a seventh latch 837 and an eighth latch 838.

The first latch 831 may latch the first bit ICAF<1> of the second internal command/address signal ICAF<1:5> when the input control signal PIN, inputted to the first latch 831, has a logic "high" level. The first latch 831 may output the latched signal of the first bit ICAF<1> of the second internal command/address signal ICAF<1:5> as the first bit DC1<1> of the first input data DC1<1:4> when the output control signal POUT, inputted to the first latch 831, has a logic "high" level.

The second latch 832 may latch the second bit ICAF<2> of the second internal command/address signal ICAF<1:5> when the input control signal PIN, inputted to the second latch 832, has a logic "high" level. The second latch 832 may output the latched signal of the second bit ICAF<2> of the second internal command/address signal ICAF<1:5> as the second bit DC1<2> of the first input data DC1<1:4> when the output control signal POUT, inputted to the second latch 83,2 has a logic "high" level.

The third latch 833 may latch the third bit ICAF<3> of the second internal command/address signal ICAF<1:5> when the input control signal PIN, inputted to the third latch 833, has a logic "high" level. The third latch 833 may output the latched signal of the third bit ICAF<3> of the second internal command/address signal ICAF<1:5> as the third bit DC1<3> of the first input data DC1<1:4> when the output control signal POUT, inputted to the third latch 833, has a logic "high" level.

The fourth latch 834 may latch the fourth bit ICAF<4> of the second internal command/address signal ICAF<1:5> when the input control signal PIN, inputted to the fourth latch 834, has a logic "high" level. The fourth latch 834 may output the latched signal of the fourth bit ICAF<4> of the second internal command/address signal ICAF<1:5> as the fourth bit DC1<4> of the first input data DC1<1:4> when the output control signal POUT, inputted to the fourth latch 834, has a logic "high" level.

The fifth latch 835 may latch the first bit ICAR<1> of the first internal command/address signal ICAR<1:3> when the input control signal PIN, inputted to the fifth latch 835, has a logic "high" level. The fifth latch 835 may output the latched signal of the first bit ICAR<1> of the first internal command/address signal ICAR<1:3> as the first bit DC2<1> of the second input data DC2<1:4> when the output control signal POUT, inputted to the fifth latch 835, has a logic "high" level and when the burst set signal WRX_BL is enabled to have a logic "high" level.

The sixth latch 836 may latch the second bit ICAR<2> of the first internal command/address signal ICAR<1:3> when the input control signal PIN, inputted to the sixth latch 836, has a logic "high" level. The sixth latch 836 may output the latched signal of the second bit ICAR<2> of the first internal command/address signal ICAR<1:3> as the second bit DC2<2> of the second input data DC2<1:4> when the output control signal POUT, inputted to the sixth latch 836, has a logic "high" level and when the burst set signal WRX_BL is enabled to have a logic "high" level.

The seventh latch 837 may latch the third bit ICAR<3> of the first internal command/address signal ICAR<1:3> when the input control signal PIN, inputted to the seventh latch 837, has a logic "high" level. The seventh latch 837 may output the latched signal of the third bit ICAR<3> of the first internal command/address signal ICAR<1:3> as the third bit DC2<3> of the second input data DC2<1:4> when the output control signal POUT, inputted to the seventh latch 837, has a logic "high" level and when the burst set signal WRX_BL is enabled to have a logic "high" level.

The eighth latch 838 may latch the fifth bit ICAF<5> of the second internal command/address signal ICAF<1:5> when the input control signal PIN, inputted to the eighth latch 838, has a logic "high" level. The eighth latch 838 may output the latched signal of the fifth bit ICAF<5> of the second internal command/address signal ICAF<1:5> as the fourth bit DC2<4> of the second input data DC2<1:4> when the output control signal POUT, inputted to the eighth latch 838, has a logic "high" level and when the burst set signal WRX_BL is enabled to have a logic "high" level.

Figure 10:
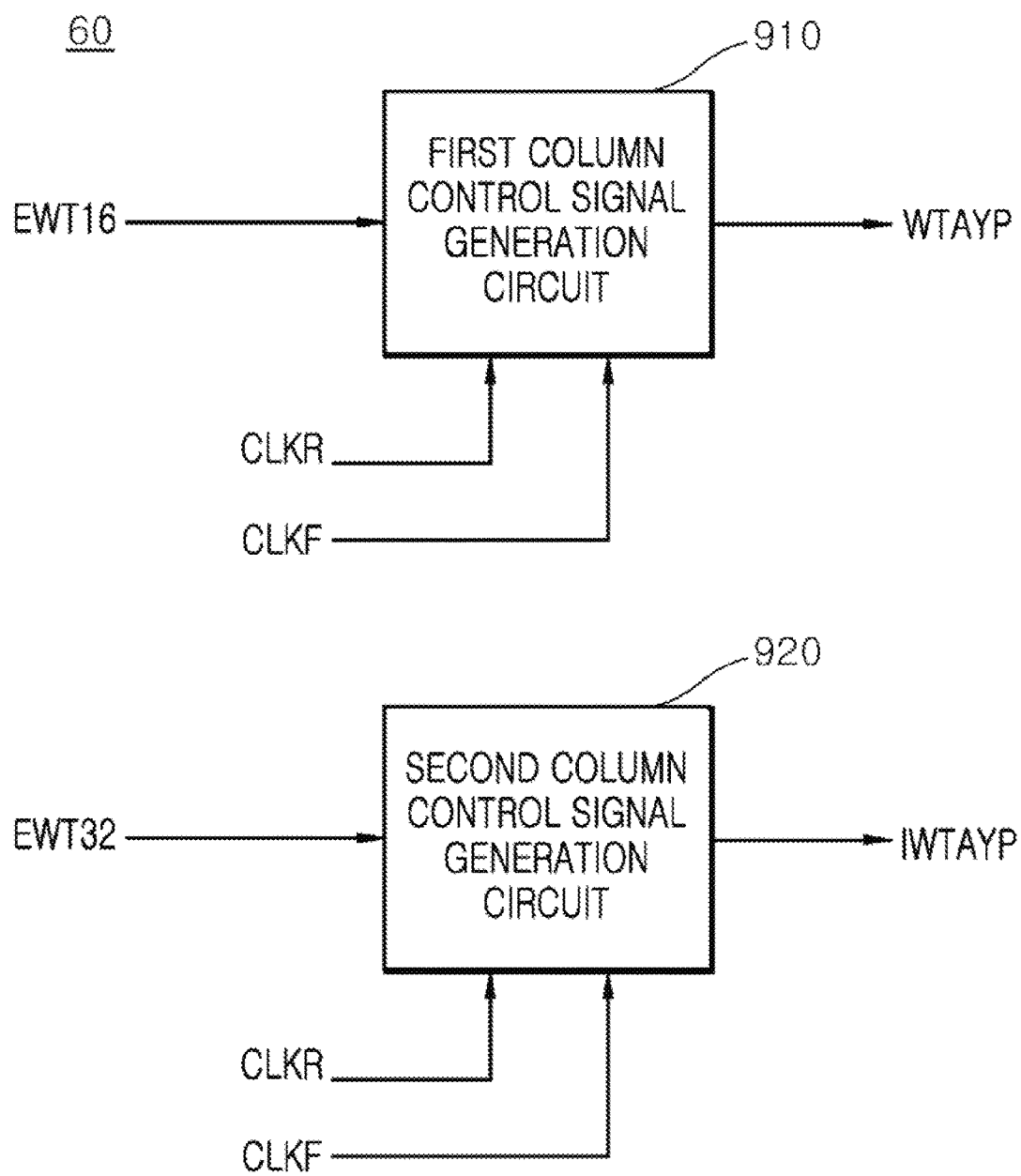
FIG. 10 is a block diagram illustrating a configuration of a column control circuit included in the semiconductor device of FIG. 1.

Referring to FIG. 10, the column control circuit 60 may include a first column control signal generation circuit 910 and a second column control signal generation circuit 920.

The first column control signal generation circuit 910 may delay the first write signal EWT16, by the write latency time, in synchronization with the first and second internal clock signals CLKR and CLKF to generate the first column control pulse WTAYP.

The second column control signal generation circuit 920 may delay the second write signal EWT32, by the write latency time, in synchronization with the first and second internal clock signals CLKR and CLKF to generate the second column control pulse IWTAYP.

Figure 11:
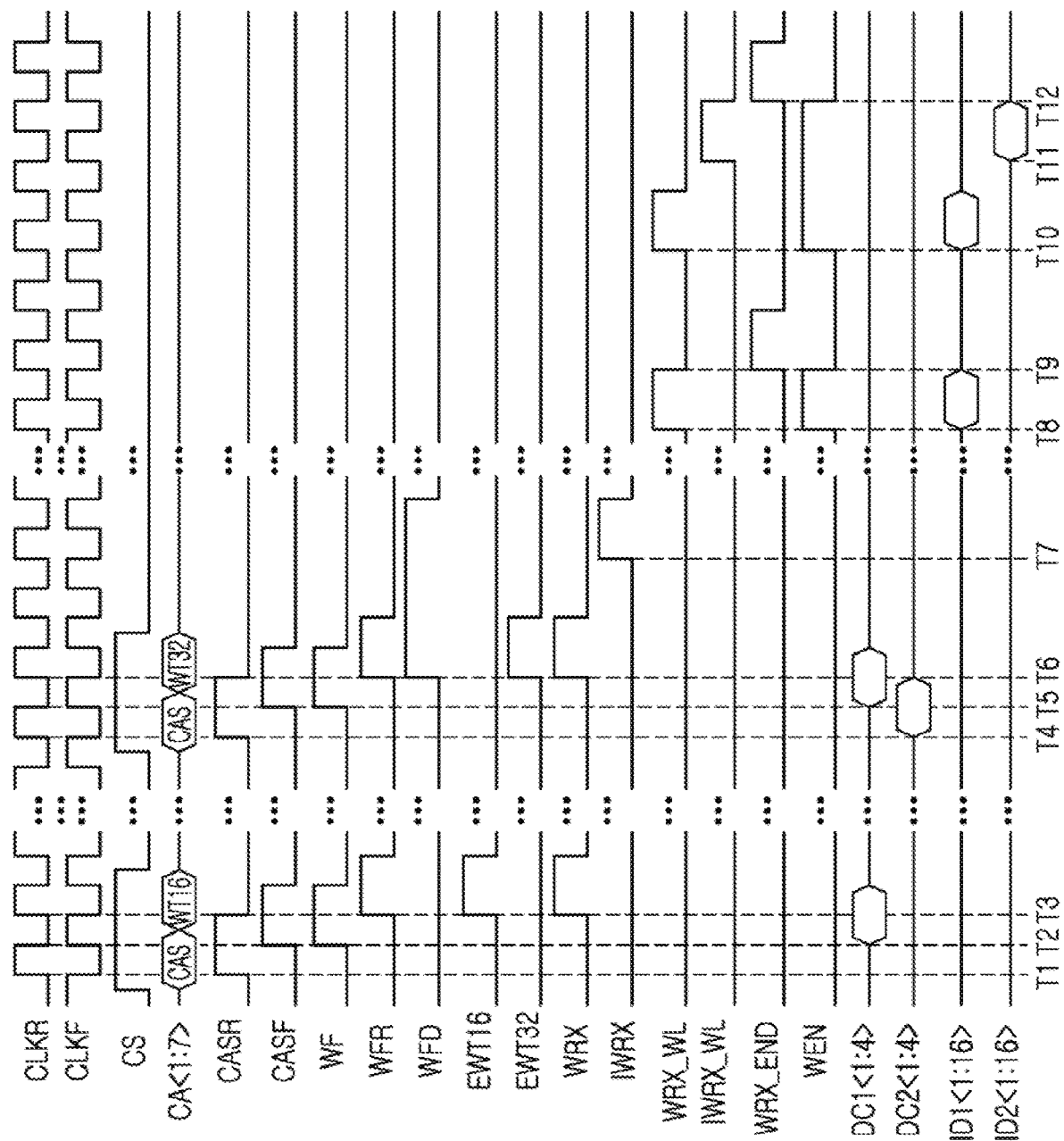
FIG. 11 is a timing diagram illustrating an operation of a semiconductor device, according to an embodiment of the present disclosure.

An operation of the semiconductor device 1, illustrated in FIGS. 1 to 10, will be described hereinafter with reference to FIG. 11 in conjunction with an example in which the first write mode and the second write mode are sequentially executed.

In advance of the description of the operation of the semiconductor device 1, the internal clock generation circuit 10 may generate the first internal clock signal CLKR and the second internal clock signal CLKF from the clock signal CLK. In such a case, the first internal clock signal CLKR may be generated to have the same phase as the clock signal CLK, and the second internal clock signal CLKF may be generated to have an inverted phase of a phase of the clock signal CLK.

First, an operation for activating the first write mode after the pattern input mode will be described hereinafter.

At a point in time "T1", the first input buffer 100 of the mode control circuit 20 may generate the rising chip selection signal CSR and the first to fourth rising command signals CAR<1:4> from the chip selection signal CS and the first to fourth command/address signals CA<1:4>. In such a case, the pattern input mode may be activated because the rising chip selection signal CSR and the first to fourth rising command signals CAR<1:4> are generated to have the first logic level combination. The first input buffer 100 may generate the operation set signal WRX_CON, having a logic "high" level, from the fifth command/address signal CA<5>. The first input buffer 100 may generate the burst set signal WRX_BL, having a logic "low" level, from the sixth command/address signal CA<6>.

The first operation signal generation circuit 210 may generate the first operation signal CASR, which is enabled to have a logic "high" because the rising chip selection signal CSR and the first to fourth rising command signals CAR<1:4> have the first logic level combination.

At a point in time "T2", the second operation signal generation circuit 220 may be synchronized with the second internal clock signal CLKF to latch the first operation signal CASR and to generate the second operation signal CASF having a logic "high" level from the latched signal of the first operation signal CASR.

The flag signal output circuit 230 may generate the flag signal WF, having a logic "high" level, from the second operation signal CASF because the operation set signal WRX_CON has a logic "high" level.

The data input circuit 40 may be synchronized with the second internal clock signal CLKF to generate the first input data DC1<1:4> from the first to fourth command/address signals CA<1:4> because the burst set signal WRX_BL is disabled to have a logic "low" level.

At a point in time "T3", the first input buffer 100 of the mode control circuit 20 may generate the rising chip selection signal CSR and the first to third rising command signals CAR<1:3> from the chip selection signal CS and the first to third command/address signals CA<1:3>. In such a case, the first write mode may be activated because the rising chip selection signal CSR and the first to third rising command signals CAR<1:3> are generated to have the second logic level combination.

The first write signal generation circuit 310 may generate the first write signal EWT16, which is enabled to have a logic "high" level because the rising chip selection signal CSR and the first to third rising command signals CAR<1:3> have the second logic level combination.

The first logic circuit 330 may generate the first write control signal EWT, which is enabled to have a logic "high" level by the first write signal EWT16 having a logic "high" level.

The first pre-control signal generation circuit 410 may be synchronized with the first internal clock signal CLKR to latch the flag signal WF and to generate the first pre-control signal WFR, having a logic "high" level, from the latched signal of the flag signal WF.

The second logic circuit 420 may buffer the first pre-control signal WFR to generate the first mode control signal WRX, having a logic "high" level, because the first write control signal EWT is enabled to have a logic "high" level.

Next, an operation for activating the second write mode after the first write mode will be described hereinafter.

At a point in time "T4", the first input buffer 100 of the mode control circuit 20 may generate the rising chip selection signal CSR and the first to fourth rising command signals CAR<1:4> from the chip selection signal CS and the first to fourth command/address signals CA<1:4>. In such a case, the pattern input mode may be activated because the rising chip selection signal CSR and the first to fourth rising command signals CAR<1:4> are generated to have the first logic level combination. The first input buffer 100 may generate the operation set signal WRX_CON, having a logic "high" level, from the fifth command/address signal CA<5>. The first input buffer 100 may generate the burst set signal WRX_BL, having a logic "high" level, from the sixth command/address signal CA<6>.

The first operation signal generation circuit 210 may generate the first operation signal CASR which is enabled to have a logic "high" because the rising chip selection signal CSR and the first to fourth rising command signals CAR<1:4> have the first logic level combination.

The data input circuit 40 may be synchronized with the first internal clock signal CLKR to generate the second input data DC2<1:3> from the fifth to seventh command/address signals CA<5:7> because the burst set signal WRX_BL is enabled to have a logic "high" level.

At a point in time "T5", the second operation signal generation circuit 220 may be synchronized with the second internal clock signal CLKF to latch the first operation signal CASR and to generate the second operation signal CASF, having a logic "high" level, from the latched signal of the first operation signal CASR.

The flag signal output circuit 230 may generate the flag signal WF, having a logic "high" level, from the second operation signal CASF because the operation set signal WRX_CON has a logic "high" level.

The data input circuit 40 may be synchronized with the second internal clock signal CLKF to generate the first input data DC1<1:4> from the first to fourth command/address signals CA<1:4> and to generate the second input data DC2<4> from the seventh command/address signal CA<7> because the burst set signal WRX_BL is enabled to have a logic "high" level.

At a point in time "T6", the first input buffer 100 of the mode control circuit 20 may generate the rising chip selection signal CSR and the first to third rising command signals CAR<1:3> from the chip selection signal CS and the first to third command/address signals CA<1:3>. In such a case, the second write mode may be activated because the rising chip selection signal CSR and the first to third rising command signals CAR<1:3> are generated to have the third logic level combination.

The second write signal generation circuit 320 may generate the second write signal EWT32, which is enabled to have a logic "high" level because the rising chip selection signal CSR and the first to fourth rising command signals CAR<1:4> have the third logic level combination.

The first logic circuit 330 may generate the first write control signal EWT, which is enabled to have a logic "high" level from the second write signal EWT32 having a logic "high" level.

The first pre-control signal generation circuit 410 may be synchronized with the first internal clock signal CLKR to latch the flag signal WF and to generate the first pre-control signal WFR, having a logic "high" level, from the latched signal of the flag signal WF.

The second logic circuit 420 may buffer the first pre-control signal WFR to generate the first mode control signal WRX, having a logic "high" level, because the first write control signal EWT is enabled to have a logic "high" level.

The burst control signal generation circuit 430 may be synchronized with the first pre-control signal WFR to generate the burst control signal BL_CON, having a logic "high" level, from the burst set signal WRX_BL.

The second pre-control signal generation circuit 440 may be synchronized with the first pre-control signal WFR to generate the second pre-control signal WFD, having a logic "high" level, from the burst control signal BL_CON.

At a point in time "T7", the shifting circuit 340 may shift the second write signal EWT32 generated at "T6" to generate the second write control signal IEWT.

The third logic circuit 450 may buffer the second pre-control signal WFD to generate the second mode control signal IWRX, having a logic "high" level, because the second write control signal IEWT is enabled to have a logic "high" level.

At a point in time "T8", the latency control circuit 500 may delay the first mode control signal WRX generated at "T3" by the write latency time according to the write latency control signal WL<1:M> to generate the first write latency signal WRX_WL having a logic "high" level.

The enablement signal generation circuit 700 may generate the write enablement signal WEN which is enabled to have a logic "high" level because the first write latency signal WRX_WL has a logic "high" level.

The internal data generation circuit 50 may generate the first internal data ID1<1:16> from the first input data DC1<1:4> generated at "T2" because the write enablement signal WEN is enabled to have a logic "high" level.

The column control circuit 60 may delay the first write signal EWT16, which is generated at "T3", by a time corresponding to the write latency, in synchronization with the first and second internal clock signals CLKR and CLKF, to generate the first column control pulse WTAYP, which is enabled to have a logic "high" level.

The core circuit 70 may store the first internal data ID1<1:16> because the first column control pulse WTAYP is enabled to have a logic "high" level.

At "T9", the selection/transmission circuit 600 may output the first write latency signal WRX_WL as the end signal WRX_END.

The enablement signal generation circuit 700 may generate the write enablement signal WEN, which is disabled to have a logic "low" level because the end signal WRX_END has a logic "high" level.

At a point in time "T10", the latency control circuit 500 may delay the first mode control signal WRX generated at "T6" by the write latency time, according to the write latency control signal WL<1:M>, to generate the first write latency signal WRX_WL having a logic "high" level.

The enablement signal generation circuit 700 may generate the write enablement signal WEN, which is enabled to have a logic "high" level because the first write latency signal WRX_WL has a logic "high" level.

The internal data generation circuit 50 may generate the first internal data ID1<1:16> from the first input data DC1<1:4>, generated at "T4," because the write enablement signal WEN is enabled to have a logic "high" level.

The column control circuit 60 may delay the first write signal EWT16, which is generated at "T6", by a time corresponding to the write latency, in synchronization with the first and second internal clock signals CLKR and CLKF, to generate the first column control pulse WTAYP, which is enabled to have a logic "high" level.

The core circuit 70 may store the first internal data ID1<1:16> because the first column control pulse WTAYP is enabled to have a logic "high" level.

At a point in time "T11", the latency control circuit 500 may delay the second mode control signal IWRX, generated at "T7," by the write latency time, according to the write latency control signal WL<1:M>, to generate the second write latency signal IWRX_WL having a logic "high" level.

The enablement signal generation circuit 700 may generate the write enablement signal WEN, which is enabled to have a logic "high" level because the second write latency signal IWRX_WL has a logic "high" level.

The internal data generation circuit 50 may generate the second internal data ID2<1:16> from the second input data DC2<1:4>, generated at "T5," because the write enablement signal WEN is enabled to have a logic "high" level.

The column control circuit 60 may delay the second write signal EWT32, which is generated at "T6", by a time corresponding to the write latency, in synchronization with the first and second internal clock signals CLKR and CLKF, to generate the second column control pulse IWTAYP, which is enabled to have a logic "high" level.

The core circuit 70 may store the second internal data ID2<1:16> because the second column control pulse IWTAYP is enabled to have a logic "high" level.

At a point in time "T12", the selection/transmission circuit 600 may output the second write latency signal IWRX_WL as the end signal WRX_END.

The enablement signal generation circuit 700 may generate the write enablement signal WEN, which is disabled to have a logic "low" level because the end signal WRX_END has a logic "high" level.

As described above, a semiconductor device, according to an embodiment, may activate a first write mode and a second write mode for storing internal data, generated from a command/address signal, after a pattern input mode, according to a logic level combination of the command/address signal, thereby reducing power consumption for activating the first and second write modes with external data.

Figure 12:
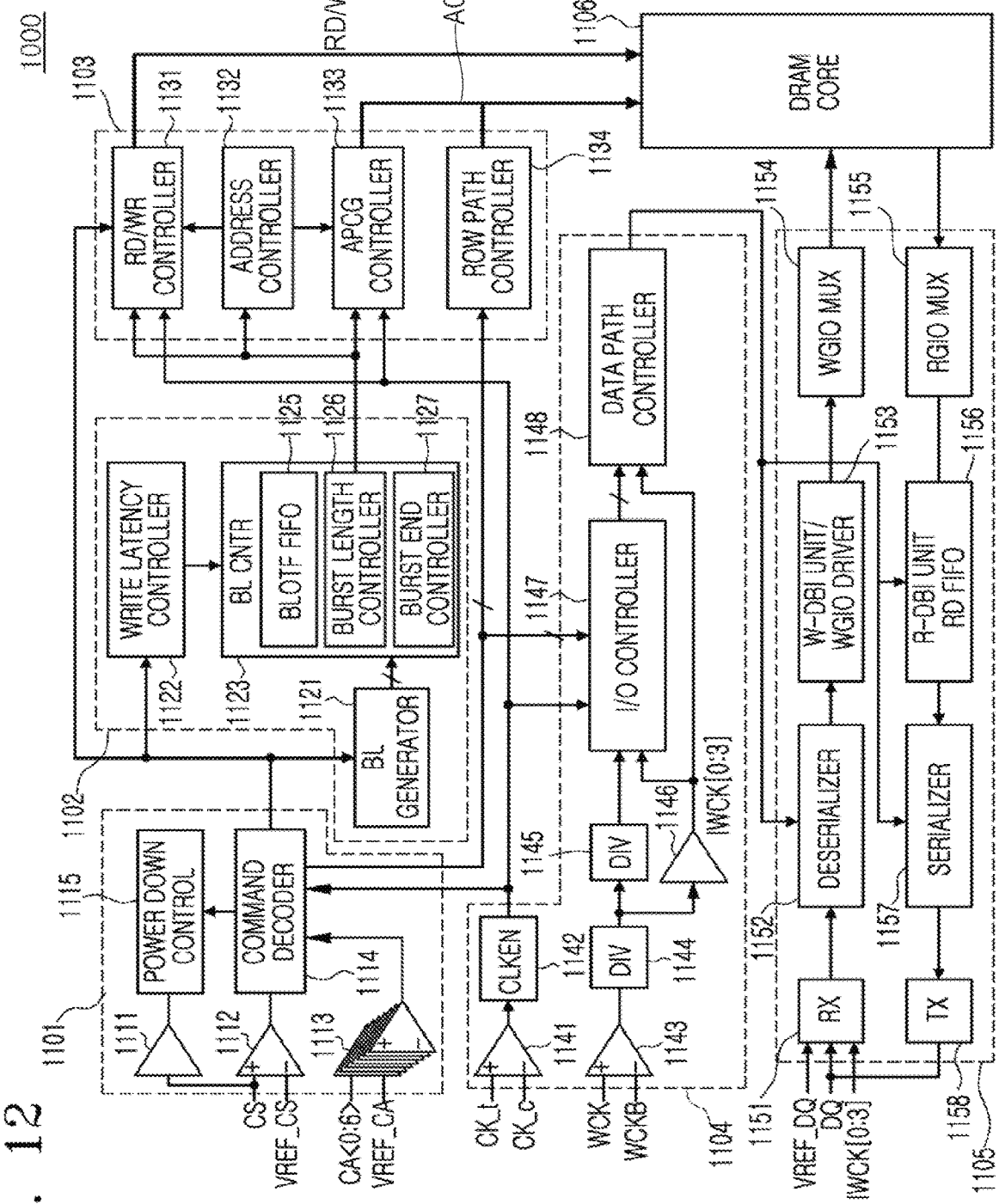
FIG. 12 is a block diagram illustrating a configuration of a semiconductor device according to another embodiment of the present disclosure.

Referring to FIG. 12, a semiconductor device 1000 according to another embodiment may include a command control circuit 1101, a latency/burst control circuit 1102, an operation control circuit 1103, an input/output (I/O) control circuit 1104, a data I/O circuit 1105 and a DRAM core 1106.

The command control circuit 1101 may include an input drive circuit 1111, a chip selection signal buffer 1112, a command/address buffer 1113, a command decoder 1114 and a power-down control circuit 1115. The input drive circuit 1111 may receive and drive a chip selection signal CS to transmit the chip selection signal CS to the power-down control circuit 1115. The chip selection signal buffer 1112 may buffer and receive the chip selection signal CS according to a chip selection reference voltage VREF_CS. The command/address buffer 1113 may buffer and receive a command/address signal CA<0:6> according to a command/address reference voltage VREF_CA. The command decoder 1114 may decode the command/address signal CA<0:6>, buffered by the command/address buffer 1113 according to the chip selection signal CS, buffered by the chip selection signal buffer 1112, to generate various commands necessary for the operation of the semiconductor device 1000. The power-down control circuit 1115 may control a power-down mode according to the chip selection signal CS driven by the input drive circuit 1111 and a command generated by the command decoder 1114.

The command control circuit 1101 may have substantially the same configuration as the mode control circuit 20 included in the semiconductor device 1, illustrated in FIG. 1, except I/O signals thereof. Accordingly, the command control circuit 1101 may be replaced with the mode control circuit 20.

The latency/burst control circuit 1102 may include a burst length information generator 1121, a write latency controller 1122 and a burst length control circuit 1123. The burst length information generator 1121 may generate information necessary for control of a burst length operation according to a command generated by the command decoder 1114. The write latency controller 1122 may perform a control operation according to a write latency according to a command transmitted through the command decoder 1114. The burst length control circuit 1123 may include an information storage circuit 1125, storing information outputted from the burst length information generator 1121. The burst length control circuit 1123 may include a burst length controller 1126 for controlling the burst length operation according to a command transmitted through the command decoder 1114, a signal outputted from the write latency controller 1122, and information outputted from the burst length information generator 1121. The burst length control circuit 1123 may include a burst end controller 1127 for controlling a burst end operation according to a command transmitted through the command decoder 1114, a signal outputted from the write latency controller 1122, and information outputted from the burst length information generator 1121.

The operation control circuit 1103 may include a read/write controller 1131, an address controller 1132, an auto-pre-charge controller 1133 and a row path controller 1134 to generate a read/write control signal RD/WR_Control for controlling a read operation and a write operation as well as a row path control signal ACT/PCG/REF_Control for controlling an active operation, a pre-charge operation and a refresh operation. The read/write controller 1131 may control the read operation and the write operation according to a signal outputted from the latency/burst control circuit 1102 and a signal outputted from the address controller 1132 if clock signals CK_t and CK_c are activated. The address controller 1132 may control generation of an address according to a signal outputted from the latency/burst control circuit 1102. The auto-pre-charge controller 1133 may control an auto-pre-charge operation according to a signal, outputted from the latency/burst control circuit 1102, if the clock signals CK_t and CK_c are activated. The row path controller 1134 may control a row path according to a command transmitted through the command decoder 1114.

The latency/burst control circuit 1102 and the operation control circuit 1103 may have substantially the same configurations as the write control circuit 30 and the column control circuit 60 included in the semiconductor device 1, illustrated in FIG. 1, except I/O signals thereof, respectively. Thus, the latency/burst control circuit 1102 and the operation control circuit 1103 may be replaced with the write control circuit 30 and the column control circuit 60, respectively.

The I/O control circuit 1104 may include a first clock buffer 1141, a clock enablement signal generator 1142, a second clock buffer 1143, a first divider 1144, a second divider 1145, an internal clock driver 1146, an I/O controller 1147 and a data path controller 1148. The first clock buffer 1141 may receive and buffer the clock signals CK_t and CK_c. The clock enablement signal generator 1142 may generate a clock enablement signal after the clock signals CK_t and CK_c buffered by the first clock buffer 241 are activated. The second clock buffer 1143 may receive and buffer data clock signals WCK and WCKB for inputting and outputting the data. The first divider 1144 may divide the data clock signals WCK and WCKB, buffered by the second clock buffer 1143. The second divider 1145 may receive and divide an output signal of the first divider 1144. The internal clock driver 1146 may receive and divide an output signal of the first divider 1144 to generate an internal data clock signal IWCK[0:3]. The I/O controller 1147 may receive a signal, divided by the second divider 1145 and the internal data clock signal IWCK[0:3], generated by the internal clock driver 1146, to control the input and output of the data. The data path controller 1148 may control a data path used in the input and output of the data, according to a signal outputted from the I/O controller 1147 and the internal data clock signal IWCK[0:3], generated by the internal clock driver 1146.

The data I/O circuit 1105 may include a receiver 1151, a deserializer 1152, a write driver 1153, a write multiplexer 1154, a read multiplexer 1155, a read driver 1156, a serializer 1157 and a transmitter 1158. The receiver 1151 may be synchronized with the internal data clock signal IWCK[0:3] to receive transmission data DQ according to a data reference voltage VREF_DQ. The deserializer 1152 may convert the transmission data DQ inputted in series through the receiver 1151 into parallel data. The write driver 1153 may drive the parallel data to transmit the driven parallel data to the write multiplexer 1154. The write multiplexer 1154 may transmit the data, driven by the write driver 1153, to the DRAM core 1106 using a multiplexing technique with an I/O line. The read multiplexer 1155 may output the data, outputted from the DRAM core 1106, through the I/O line to the read driver 1156 using a multiplexing technique during the read operation. The read driver 1156 may drive the data, outputted from the DRAM core 1106, through the read multiplexer 1155 to output the driven data to the serializer 1157. The serializer 1157 may convert the data outputted from the read driver 1156 into serial data. The transmitter 1158 may output the serial data, converted by the serializer 1157, as the transmission data DQ.

The I/O control circuit 1104 and the data I/O circuit 1105 may have substantially the same configurations as the data input circuit 40 and the internal data generation circuit 50 included in the semiconductor device 1, illustrated in FIG. 1, except I/O signals thereof, respectively. Thus, the I/O control circuit 1104 and the data I/O circuit 1105 may be replaced with the data input circuit 40 and the internal data generation circuit 50, respectively.

The DRAM core 1106 may perform the read operation or the write operation for outputting or receiving the data through the data I/O circuit 1105 according to the read/write control signal RD/WR_Control. The DRAM core 1106 may perform the active operation, the pre-charge operation, or the refresh operation according to the row path control signal ACT/PCG/REF_Control.

The DRAM core 1106 may have substantially the same configuration as the core circuit 70 included in the semiconductor device 1, illustrated in FIG. 1, except I/O signals thereof. Thus, the DRAM core 1106 may be replaced with the core circuit 70.

What is claimed is:

1. A semiconductor device comprising:
    a mode control circuit configured to activate a pattern input mode according to a logic level combination of a chip selection signal, configured to activate a command/address signal to generate an operation set signal from the command/address signal, and configured to generate a mode control signal, which is enabled by the operation set signal, according to a logic level combination of the chip selection signal and the command/address signal, in a write mode after the pattern input mode is activated;
    a write control circuit configured to generate a write enablement signal, which is enabled according to a logic level of the mode control signal; and
    an internal data generation circuit configured to generate internal data to be stored into a core circuit according to the write enablement signal.

2. The semiconductor device of claim 1, wherein the internal data generation circuit is configured to output an external data as the internal data when the write enablement signal is enabled and configured to output an input data as the internal data when the write enablement signal is disabled.

3. The semiconductor device of claim 1, further comprising:
    the mode control circuit configured to generate a burst set signal from the command/address signal; and
    a data input circuit configured to be synchronized with a first internal clock signal and a second internal clock signal, according to the burst set signal, to generate a first input data and a second input data from the command/address signal.

4. The semiconductor device of claim 1, wherein the pattern input mode is an operation mode for storing the internal data in the core circuit by decoding an input data, inputted according to the command/address signal.

5. The semiconductor device of claim 1, wherein the pattern input mode is activated when the chip selection signal and the command/address signal, inputted in synchronization with a rising edge of a clock signal, have a first logic level combination.

6. The semiconductor device of claim 1, wherein the operation set signal is generated from any bit of the command/address signal, which is inputted in synchronization with a falling edge of a clock signal.

7. The semiconductor device of claim 1, wherein the input data is generated from at least two bits of the command/address signal, which is inputted in synchronization with a falling edge of a clock signal.

8. The semiconductor device of claim 1, wherein the mode control circuit includes:
    an input buffer configured to latch the chip selection signal in synchronization with a first internal clock signal to generate a rising chip selection signal, configured to be synchronized with the first internal clock signal to generate a rising command signal from the command/address signal, and configured to be synchronized with a second internal clock signal to generate the operation set signal from any bit of the command/address signal;
a flag signal generation circuit configured to be synchronized with the second internal clock signal to generate a flag signal, which is enabled when the rising chip selection signal and the rising command signal have a first logic level combination and the operation set signal has a first logic level;
a write control signal generation circuit configured to generate a write control signal which is enabled when the rising chip selection signal and the rising command signal have a second logic level combination; and
a mode control signal generation circuit configured to be synchronized with the first internal clock signal to generate the mode control signal when both the flag signal and the write control signal are enabled.

9. The semiconductor device of claim 8, wherein the flag signal generation circuit includes:
a first operation signal generation circuit configured to generate a first operation signal, which is enabled when the rising chip selection signal and the rising command signal have the first logic level combination;
a second operation signal generation circuit configured to be synchronized with the second internal clock signal to latch the first operation signal and configured to output the latched signal of the first operation signal as a second operation signal; and
a flag signal output circuit configured to generate the flag signal from the second operation signal when the operation set signal has the first logic level.

10. The semiconductor device of claim 8, wherein the mode control signal generation circuit includes:
a pre-control signal generation circuit configured to be synchronized with the first internal clock signal to latch the flag signal and to generate a pre-control signal from the latched flag signal; and
a logic circuit configured to buffer the pre-control signal to generate the mode control signal when the write control signal is enabled.

11. The semiconductor device of claim 1, wherein the write control circuit includes:
a latency control circuit configured to delay the mode control signal by a write latency time to generate a write latency signal;
a selection/transmission circuit configured to shift the write latency signal to output the shifted write latency signal as an end signal; and
an enablement signal generation circuit configured to generate the write enablement signal, which is enabled when the write latency signal is inputted and disabled when the end signal is inputted.

12. A semiconductor device comprising:
a mode control circuit configured to activate a pattern input mode according to a logic level combination of a chip selection signal, configured to activate a command/address signal to generate an operation set signal and a burst set signal from the command/address signal and configured to generate a first mode control signal and a second mode control signal which are enabled by the operation set signal, according to a logic level combination of the chip selection signal and the command/address signal, in a first write mode and a second write mode, after the pattern input mode is activated; and
a write control circuit configured to generate a write enablement signal, which is enabled according to logic levels of the first mode control signal and the second mode control signal.

13. The semiconductor device of claim 12, further comprising:
a data input circuit configured to be synchronized with a first internal clock signal and a second internal clock signal, according to the burst set signal, to generate a first input data and a second input data from the command/address signal.

14. The semiconductor device of claim 12, further comprising:
an internal data generation circuit configured to output an external data as an internal data when the write enablement signal is enabled and configured to output an input data as the internal data when the write enablement signal is disabled.

15. The semiconductor device of claim 12, wherein the pattern input mode is an operation mode for storing the first and second internal data in the core circuit by decoding the first and second input data inputted according to the command/address signal.

16. The semiconductor device of claim 12, wherein the pattern input mode is activated when the chip selection signal and the command/address signal, inputted in synchronization with a rising edge of a clock signal, have a first logic level combination.

17. The semiconductor device of claim 12,
wherein the first write mode is activated when the chip selection signal and the command/address signal, inputted in synchronization with a rising edge of a clock signal, have a second logic level combination; and
wherein the second write mode is activated when the chip selection signal and the command/address signal, inputted in synchronization with a rising edge of the clock signal, have a third logic level combination.

18. The semiconductor device of claim 12, wherein the mode control circuit includes:
a first input buffer configured to latch the chip selection signal in synchronization with the first internal clock signal to generate a rising chip selection signal, configured to be synchronized with the first internal clock signal to generate a rising command signal from the command/address signal, configured to be synchronized with the second internal clock signal to generate the operation set signal from a bit included in the command/address signal, and configured to be synchronized with the second internal clock signal to generate the burst set signal from another bit included in the command/address signal;
a flag signal generation circuit configured to be synchronized with the second internal clock signal to generate a flag signal which is enabled when the rising chip selection signal and the rising command signal have a first logic level combination and the operation set signal has a first logic level;
a write control signal generation circuit configured to generate a first write control signal which is enabled when the rising chip selection signal and the rising command signal have a second logic level combination and configured to generate the first write control signal and a second write control signal which are sequentially enabled when the rising chip selection signal and the rising command signal have a third logic level combination; and a mode control signal generation circuit configured to be synchronized with the first internal clock signal to generate the first mode control signal when both the flag signal and the first write control signal are enabled and configured to be synchronized with the first internal clock signal to generate the second mode control signal when the flag signal, the burst set signal and the second write control signal are enabled.

19. The semiconductor device of claim 18, wherein the flag signal generation circuit includes:
a first operation signal generation circuit configured to generate a first operation signal, which is enabled when the rising chip selection signal and the rising command signal have the first logic level combination;
a second operation signal generation circuit configured to be synchronized with the second internal clock signal to latch the first operation signal and configured to output the latched signal of the first operation signal as a second operation signal; and
a flag signal output circuit configured to generate the flag signal from the second operation signal when the operation set signal has the first logic level.

20. The semiconductor device of claim 18, wherein the write control signal generation circuit includes:
a first write signal generation circuit configured to generate a first write signal, which is enabled when the rising chip selection signal and the rising command signal have the second logic level combination;
a second write signal generation circuit configured to generate a second write signal which is enabled when the rising chip selection signal and the rising command signal have the third logic level combination;
a first logic circuit configured to generate the first write control signal, which is enabled when one of the first and second write signals is enabled; and
a shifting circuit configured to shift the second write signal by a write latency time to generate the second write control signal.

21. The semiconductor device of claim 18, wherein the mode control signal generation circuit includes:
a first pre-control signal generation circuit configured to be synchronized with the first internal clock signal to latch the flag signal and to generate a first pre-control signal from the latched flag signal;
a second logic circuit configured to buffer the first pre-control signal to generate the first mode control signal when the first write control signal is enabled;
a burst control signal generation circuit configured to latch the burst set signal in synchronization with the first pre-control signal to generate a burst control signal;

a second pre-control signal generation circuit configured to latch the burst control signal in synchronization with the first pre-control signal to generate a second pre-control signal; and
a third logic circuit configured to buffer the second pre-control signal to generate the second mode control signal when the second write control signal is enabled.

22. The semiconductor device of claim 12, wherein the write control circuit includes:
a latency control circuit configured to delay the first and second mode control signals by a write latency time to generate a first write latency signal and a second write latency signal and configured to delay the burst set signal by the write latency time to generate a burst shift signal;
a selection/transmission circuit configured to shift the first and second write latency signals according to the burst shift signal and configured to output any one of the shifted signals of the first and second write latency signals as an end signal; and
an enablement signal generation circuit configured to generate the write enablement signal, which is enabled when the first write latency signal is inputted and disabled when the end signal is inputted.

23. The semiconductor device of claim 12, wherein the data input circuit includes:
a pipe control circuit configured to generate an input control signal and an output control signal, which are sequentially enabled according to a flag signal and a first write latency signal;
a second input buffer configured to be synchronized with a first internal clock signal to generate a first internal command/address signal from the command/address signal and configured to be synchronized with a second internal clock signal to generate a second internal command/address signal from the command/address signal; and
a pipe circuit configured to latch the first internal command/address signal and the second internal command/address signal when the input control signal is inputted and configured to generate the first input data and the second input data from the first and second internal command/address signals according to a logic level of the burst set signal.

24. The semiconductor device of claim 22, wherein the pipe circuit is configured to generate the first input data from the first internal command/address signal when the burst set signal is disabled and is configured to generate the first and second input data from the first and second internal command/address signals when the burst set signal is enabled.

* * * * *